(12) United States Patent
Kim et al.

(10) Patent No.: US 11,574,902 B2
(45) Date of Patent: Feb. 7, 2023

(54) CLAMP FOR POWER TRANSISTOR DEVICE

(71) Applicant: TEXAS INSTRUMENTS INCORPORATED, Dallas, TX (US)

(72) Inventors: Eung Jung Kim, Allen, TX (US); Kyle Clifton Schulmeyer, Plano, TX (US); Sualp Aras, Dallas, TX (US); Md Abidur Rahman, Richardson, TX (US); Xiaochun Zhao, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 216 days.

(21) Appl. No.: 16/264,065

(22) Filed: Jan. 31, 2019

(65) Prior Publication Data
US 2020/0251465 A1    Aug. 6, 2020

(51) Int. Cl.
G05F 1/565    (2006.01)
H01L 27/02    (2006.01)
H02H 9/04    (2006.01)

(52) U.S. Cl.
CPC .......... H01L 27/0255 (2013.01); G05F 1/565 (2013.01); H02H 9/046 (2013.01)

(58) Field of Classification Search
CPC .................................................. H01L 27/0255
See application file for complete search history.

(56) References Cited

U.S. PATENT DOCUMENTS

| | | | | |
|---|---|---|---|---|
| 5,608,595 A * | 3/1997 | Gourab | .............. | H03K 17/0826 361/88 |
| 8,390,360 B2 * | 3/2013 | Gist, III | .............. | H01L 27/0285 327/309 |
| 10,177,556 B2 | 1/2019 | Bakhali et al. | | |
| 2013/0242449 A1 * | 9/2013 | Kato | ...................... | H02H 9/041 361/111 |
| 2014/0211349 A1 * | 7/2014 | Braun | .................... | H02H 9/046 361/56 |
| 2017/0125085 A1 | 5/2017 | Kim et al. | | |
| 2017/0373494 A1 | 12/2017 | Pok et al. | | |
| 2018/0083443 A1 | 5/2018 | Mertens et al. | | |

FOREIGN PATENT DOCUMENTS

EP    0717497 A2    6/1996

OTHER PUBLICATIONS

International Search Report and Written Opinion dated Apr. 30, 2020, PCT Application No. PCT/US2020/015346, 7 pages.
Extended European Search Report dated Feb. 15, 2022, European Application No. 20747579.9, 10 pages.

* cited by examiner

*Primary Examiner* — Nguyen Tran
(74) *Attorney, Agent, or Firm* — Ray A. King; Frank D. Cimino (57) ABSTRACT

A system includes a clamp network coupled between an input and an output and configured to clamp a voltage between the input and the output to a first clamp voltage based on the presence of a trigger signal and to a second clamp voltage based on the absence of the trigger signal. The second clamp voltage is greater than the first clamp voltage and the first clamp voltage is less than a breakdown voltage of the power transistor device. A detector circuit is coupled to the input and the output. A power transistor device may also be coupled between the input and the output. The detector circuit is configured to detect a pulse signal at the input or the output while the power transistor device is off and to generate the trigger signal for a time interval based on detecting the pulse signal.

17 Claims, 7 Drawing Sheets

CLAMP FOR POWER TRANSISTOR DEVICE

TECHNICAL FIELD

This disclosure relates to integrated circuits and, more particularly, to a clamp for power transistor device.

BACKGROUND

Switch devices, such as power metal oxide field effect transistors (MOSFETs), are used for a wide range of applications. In automotive and other applications, the switch devices are subjected to a wide range of voltage supplies and even a wider range of transient electrical disturbances, such as may occur when disconnecting inductive loads, sudden power cutoffs, switch bouncing or the like. As one example, electrical transients occur across a switch device when a vehicle battery is suddenly disconnected while being charged (e.g., by an alternator or during a jump-start). Thus, clamping circuitry is utilized to protect the switch devices against these and other transient electrical disturbances. In many applications, the clamping needs to satisfy a variety of industry standards, such as those established by the International Organization for Standardization (ISO).

SUMMARY

In one example, a clamp device includes a detector circuit configured to be coupled, respectively, to an input and an output of a switch device. The detector circuit includes a first detector circuit configured to generate a trigger signal for a duration based on detecting a pulse signal provided at the output while the switch device is off. The detector circuit includes a second detector circuit configured to activate the first detector circuit to generate the trigger signal based on detecting a pulse signal provided at the input while the switch device is off. A clamp network is configured to clamp a voltage between the input and the output to a first clamp voltage in response to the trigger signal and to a second clamp voltage in the absence of the trigger signal while the switch device is off. The second clamp voltage is greater than the first clamp voltage and the first clamp voltage is greater than a predetermined supply voltage at the input.

In another example, a clamp circuit includes a clamp network including a plurality of diodes connected in series between an input voltage node and an output voltage node. A first detector circuit is coupled between the input voltage node and the output voltage node. The first detector circuit has an input coupled to the output voltage node. The first detector includes a switch network coupled between the input voltage node and an intermediate node of the clamp network between an adjacent pair of the plurality of diodes. A second detector circuit has an input coupled to the input voltage node and an output coupled to a control input of the first detector circuit.

In yet another example, a system includes a power transistor device coupled between an input and an output. A clamp network is coupled between the input and the output and configured to clamp a voltage between the input and the output to a first clamp voltage based on the presence of a trigger signal and to a second clamp voltage based on the absence of the trigger signal. The second clamp voltage is greater than the first clamp voltage and the first clamp voltage is less than a breakdown voltage of the power transistor device. A detector circuit is connected to the input and the output. The detector circuit is configured to detect a pulse signal at the input or the output while the power transistor device is off and to generate the trigger signal for a time interval based on detecting the pulse signal.

DETAILED DESCRIPTION

This disclosure relates to a clamp circuit and method used to protect switch devices during a variety of different transient load conditions.

The clamp circuit includes a clamp network coupled between an input and an output. A switch device, such as a transistor, can be connected between the input and output, such as to control the supply of electrical power to a load. The switch device may be is a power transistor device (e.g., a field effect transistor (FET) or bipolar junction transistor (BJT). For example, the clamp network is configured to protect the switch device from electrical disturbances at the input or output, such as by varying a clamp voltage based on a transient electrical condition that is detected at the input and/or output.

As an example, the clamp circuit includes a pulse detector circuit that is coupled to monitor the input or output of the switch device (when connected). The detector circuit is configured to detect a pulse signal at the input or the output while the power transistor device is off. The detector circuit is configured to generate a trigger signal, which may be sustained for a time interval based on detecting the pulse signal. The detector circuit may include one or more timer circuits configured to set a time interval for providing the trigger signal to allow sufficient time to turn on the clamp network during the detected pulse signal. The clamp network is configured to provide an adaptive clamp voltage between the input and output based on the presence or absence of the trigger signal. For example, the clamp network provides a first clamp voltage in response to the trigger signal and to a second clamp voltage in the absence of the trigger signal. Additionally, the second clamp voltage is greater than the first clamp voltage, and the first clamp voltage may be less than a breakdown voltage of the power transistor device but greater than a predetermined supply voltage (e.g., a maximum expected voltage) provided at the input.

As a further example, the clamp circuit may be configured to implement clamping without requiring any bias circuit, such that the pulses at the input or output can be detected during complete off-state of the switch device. Additionally, by adaptively controlling clamp voltage, as disclosed herein, a power transistor device having a lower breakdown voltage can be used. For the example of using the clamp circuit to protect a power FET for automotive applications, the breakdown voltage (BVDSS) of the power FET can be significantly reduced by eliminating load-dump limitation, which further helps to improve the overall area efficiency of the power FET. Additionally, because the adaptive clamping enables a single clamp circuit to be utilized to clamp to protect the power FET from pulses at the input and/or output, the circuit can be implemented in a smaller area in semiconductor die. As a result, by configuring the clamp system as disclosed herein, a smaller and lower cost power switch device may be implemented without compromising desired clamping functions.

As used herein, the term circuit can include a collection of active and/or passive elements that perform a circuit function such as an analog circuit or control circuit. Additionally, or alternatively, the term circuit can include an integrated circuit (IC) where all or some of the circuit elements are fabricated on a common substrate, such as a semiconductor device (e.g., IC chip or die). For example, an IC chip can include the clamp circuit (e.g., clamp network and detector circuitry), which may further include (or not include) the power switch device.

Figure 1:
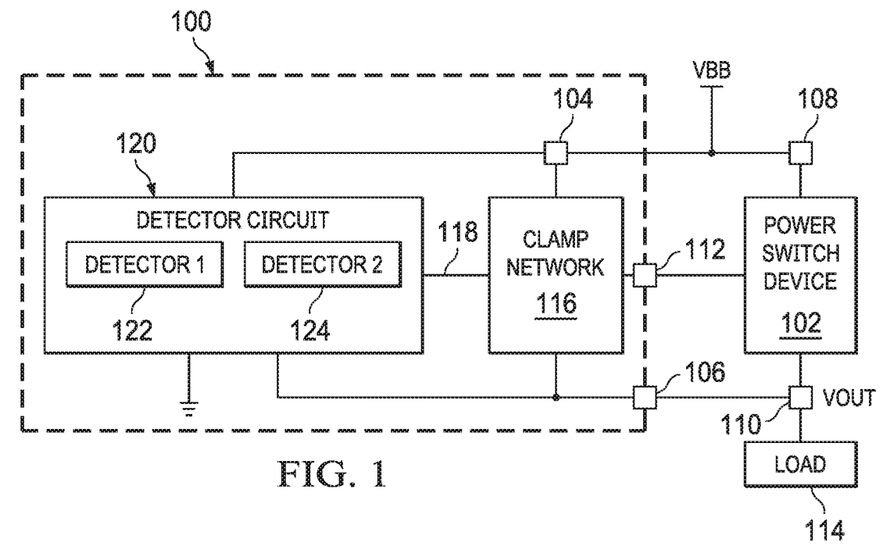
FIG. 1 illustrates block diagram of an example of a switch protection system.

FIG. 1 is block diagram of a system 100 for protecting a power switch device 102. The system 100 includes inputs 104 and 106 to coupled to an input voltage (VBB) and an output voltage (VOUT). The power switch device 102 includes an input 108 coupled between to the input voltage VBB and an output 110 coupled to the output voltage VOUT. For purposes of system operation, the input 104 and 108 may be considered the same node, and 106 and 110 may also be considered the same node. The power switch device 102 also includes a control input 112 to turn on or off the switch device 102 to control the supply of electrical power through the switch device to a load 114. As an example, the input voltage VBB is a supply voltage provided a DC power supply, such as in a vehicle (e.g., automobile, boat, aircraft, etc.). For the example of automotive applications, the input voltage VBB has a maximum supply voltage of approximately 28V+/−15%. In other examples, the maximum supply voltage of VBB may be a different voltage level depending on application requirements.

The protection system 100 is configured to clamp the voltage between the input 108 and the output 110 of the power switch device 102 over a variety of different transient electrical disturbances, which clamping depends on device parameters and further can vary according to application requirements. For example, as described herein, the protection system 100 is configured to set its clamp voltage to allow (without clamping) a predetermined supply voltage (e.g., a maximum expected supply voltage) at VBB during both normal operation and load dump conditions as well as to set the clamp voltage below the breakdown voltage (BVDSS) of the power switch device 102. Process and temperature variations of the circuitry in the protection system 100 are additional parameters that may be used in setting the clamp voltage. By configuring the protection system as disclosed herein, a smaller and lower cost power switch device may be implemented.

In the example of FIG. 1, the protection system 100 includes a clamp network 116 coupled between the input 108 and the output 110 of the switch device. The clamp network 116 may also be coupled to the control input 112 of the power switch device 102. The clamp network 116 is configured to clamp the voltage between the input 108 and the output 110 to a clamp voltage that varies based on the presence or absence of a trigger signal from a pulse detector circuit 120 while the switch device 102 is off. For example, the clamp network 116 clamps the voltage between nodes 108 and 110 to a first clamp voltage based on the presence of the trigger signal and to a second clamp voltage in the absence of the trigger signal. For example, the second clamp voltage is greater than the first clamp voltage and the first clamp voltage is greater than a maximum supply voltage VBB. Additionally, if the switch device 102 is turned on (e.g., to supply the input voltage VBB to the load 114) or no load is connected to the output 110, the clamping function may be disabled or otherwise be rendered inoperative.

As a further example, the detector circuit 120 includes a switch network connected between the input and an intermediate node of the clamp network. The connection between the detector circuit and the intermediate node is demonstrated at 118. The switch network is configured to connect the intermediate node 118 to the input 108 in response to the trigger signal as to bypass a portion of the clamp network and reduce the clamp voltage to the first clamp voltage. In the absence of the trigger signal, such portion of the clamp network is not bypassed but instead forms part of the active circuit path of the clamp network to provide the second clamp voltage while the switch device is turned off. While the switch device 102 is off, neither the detector circuit 120 nor the clamp network 116 requires active bias current, such that the protection system 100 consumes little or no current during the off state.

The detector circuit 120 is coupled to each of the voltage VBB at the input 108 and the voltage VOUT at the output 110 of the power switch device 102. The detector circuit 120 is configured to monitor and detect a pulse signal at the input 108 or the output 110 while the power switch device 102 is off. The detector circuit 120 is further configured to generate the trigger signal based on detecting the pulse at 108 or 110 to activate the clamp network to clamp the detected pulse to the first clamp voltage. The detector circuit 120 can provide the trigger signal for a time interval when it detects the pulse signal (e.g., by using a timer circuit to set the time interval).

In an example, the detector circuit 120 includes a first detector circuit 122 and a second detector circuit 124. The first detector circuit 122 is coupled to the output 110 to monitor the voltage VOUT and is configured to generate the trigger signal (e.g., held for a period of time) in response to detecting a pulse signal at the output while the switch device is off. For example, first detector circuit 122 is configured to detect the negative pulse signal at 110 corresponding to a voltage waveform pulse having minimum peak amplitude and rise time parameters, which may further repeat at a prescribed rate, such as established by ISO (see, e.g., negative ISO pulse in FIG. 3B).

The second detector circuit 124 is coupled to input 108 to monitor the voltage VBB and configured to provide a control signal to activate the first detector circuit in response detecting a pulse signal provided at the input while the switch device is off. For example, second detector circuit 124 is configured to detect a positive pulse signal at 108 corresponding to a voltage waveform pulse having peak amplitude, fall and rise time parameters, such as established by ISO (see, e.g., positive ISO pulse in FIG. 3A). In response to such control signal, the first detector circuit 122 is configured to generate the trigger signal for a period of time.

For example, each of the first and/or second detector circuits 122 and 124 includes a filter circuit and timing circuit to control generating the trigger signal and sustaining the trigger for a period of time, respectively. For example, the filter circuit can be configured as a high pass filter to pass transient pulse signals that change rapidly (above a cutoff frequency), while blocking signals that change more slowly (below the cutoff frequency). The timer circuit can be configured to hold the detected transient pulse signals for a duration to enable the clamp network 116 to clamp the transient pulse for a time duration that is at least sufficient for the detected transient to terminate or at least dissipate to a safe level.

By way of further example, the clamp network 116 includes a plurality of diodes connected in series between the input 108 and the output 110 to set the clamp voltage based on the breakdown voltage of the series-connected diodes. As mentioned, the first detector circuit 122 may include a switch network or other circuitry coupled between the input node 108 and the intermediate node 118 of the clamp network between an adjacent pair of the plurality of diodes. The detector circuit 120 can generated the trigger signal to activate the switch network or other circuitry as to couple the intermediate node to the input 108. In this way, the switch network or other circuitry electrically bypasses (e.g., shunts) each one or more of the diodes between the input node 108 and the intermediate node 118. As a result, the remaining one or more diodes, which are connected between the intermediate clamp node 118 and the output node 110 form an active circuit path of the clamp network to provide the first clamp voltage that is set based on a sum of breakdown voltages of the diodes connected in such active circuit path. The first clamp voltage thus is at a reduced level compared to the second clamp voltage that is provided in the absence of the trigger signal. As mentioned, in the absence of the detector circuit 120 providing the trigger signal, one or more of the diodes between the input node 108 and the intermediate node are included in the active circuit path of the clamp network (along with each diode between the intermediate node and output 110) such that the clamp network 116 provides the second clamp voltage between the input 108 and the output 110.

Figure 2:
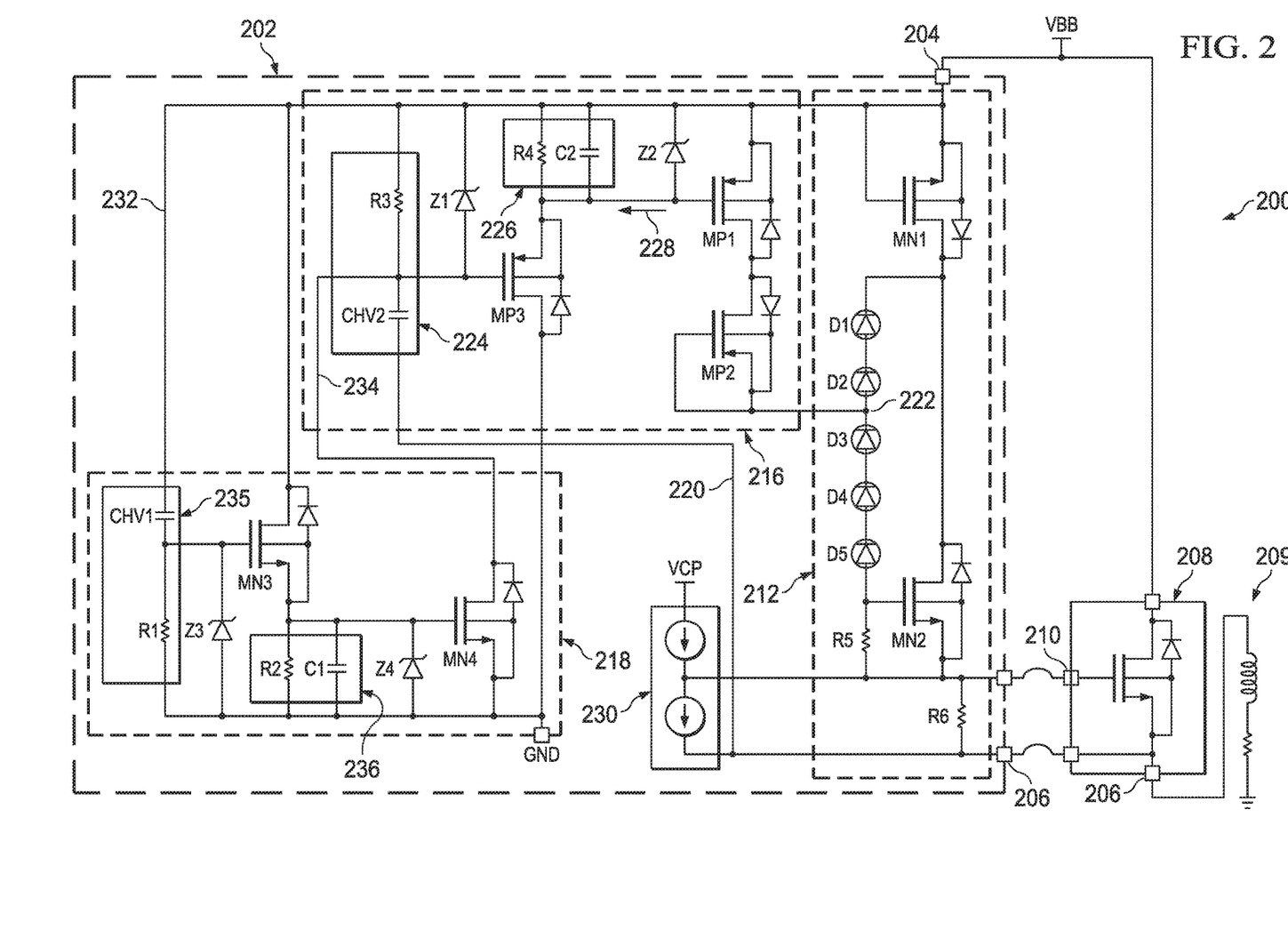
FIG. 2 illustrates an example circuit of the switch protection system of FIG. 1.

FIG. 2 depicts an example of a protection system 200, such as corresponding to the system 100 of FIG. 1. The system 200 includes a clamp circuit 202 connected between an input node 204 and an output node 206. A power transistor device 208 is connected between the input node 204 and output node 206. The input node 204 can be coupled to an input supply voltage (VBB). The output node 206 can be coupled to circuitry 209 demonstrated as including an inductor (e.g., part of a power converter) and resistor (e.g., representing a load) is connected in series between the output node 206 and an electrical ground. For example, the transistor device 208 can correspond to a high-side transistor device of a bridge network of a power converter (e.g., switching power supply), which is turned on and off based on a control signal provided to a control input 210. Through operation of the transistor device 208, the power converter thus can supply current through the inductor to provide a regulated voltage to the load. In the example of FIG. 2 the transistor device 208 is demonstrated as an n-type metal oxide semiconductor (NMOS) FET, in which the node 204 is connected to the drain of the FET and the output node 206 is connected to the source of the FET. In this example, the clamp circuit 202 is also coupled to the gate of the FET 208 corresponding to the control input 210.

The clamp circuit 202 is configured to adaptively clamp the drain-to-source voltage of the FET 208 between 204 and 206. The clamp circuit 202 includes a clamp network 212 coupled between the input node 204 and output 206. The clamp network 212 is configured to clamp the voltage between the input and output 204 and 206 to a clamp voltage that depends on the presence or absence of a trigger signal being generated by an associated detector circuit 216, 218 in response to detecting a transient electrical disturbance (e.g., a pulse) at one or both nodes 204 and 206.

In the example of FIG. 2, the clamp network 212 includes a plurality of diodes D1, D2, D3, D4 and D5 coupled in series between the input node 204 and the output node 206. For example, the diodes D1, D2, D3, D4 and D5 are implemented as reverse breakdown diodes (e.g., having a known breakdown voltage, such as about 10V). An NMOS FET MN1 is connected between the input node 204 and D1. A resistor R5 is coupled between diode D5 and the control input (e.g., gate) 210 of transistor device 208. Another NMOS FET MN2 is connected between the drain of MN1 and the control input node 210 and having its gate connected to the node between R5 and D5. Another resistor R6 is connected between the control input node 210 and the output node 206 (between the gate and source of the power FET 208). A gate driver 230 may be configured to provide corresponding pull-up and pull-down current to the respective gate and drain nodes.

In this example, the detector circuit includes a first detector circuit 216 and a second detector circuit 218. The first detector circuit 216 is connected between the input node 204 and the output 206. In particular, the first detector circuit 216 has an input 220 coupled to the output node 206 to monitor signals at the output. The first detector circuit 216 also includes a switch network of p-type FETs MP1 and MP2 coupled between the input node 204 and an intermediate node 222 of the clamp network 212 (e.g., between diodes D2 and D3). As disclosed herein, the first detector circuit 216 is configured to generate a trigger signal 228 for controlling FETs MP1 and MP2 based on detecting a pulse signal at the output node 206 while the transistor device 208 is off.

As an example, the first detector circuit 216 includes a filter 224 coupled to the output node 206 through input 220. The filter 224 can include a resistor R3 connected in series with a capacitor CHV2 between the input node 204 and the output node 206 to form a high pass filter for signals provided at the output 206 through input 220. For example, the filter 224 is configured to pass fast changing transient voltage signals at the output 206 (e.g., transient pulse signals above a cutoff frequency) and attenuate or block signals that change more slowly (e.g., pulses below the cutoff frequency). The filter 224 thus provide a corresponding filtered pulse signal at the intermediate node between R3 and CHV2 for signals above a cutoff frequency. In this way, the filter signal is provided to a gate of PMOS FET MP3 is used to trigger the clamp network 212 in response to detecting fast-changing pulse signals at the output 206. The gate is also coupled to the input node 204 through a Zener diode Z1 in parallel with R3 to clamp the voltage across R3. If the pulse detected at 206 has sufficient voltage for a sufficient period of time, the PMOS FET MP3 turned on. The drain of MP3 is connected to electrical ground (e.g., the same ground as the load 209) and the source of MP3 is connected to a timer circuit 226.

For example, the timer circuit 226 includes a resistor R4 connected in parallel with a capacitor C2 between the input node 204 and the source of MP3. A Zener diode Z2 can also be connected in parallel with the timer circuit 226 to clamp the voltage provided by the timer circuit. The timer circuit 226, in turn, which provides the corresponding trigger signal 228 to the switch network MP1 and MP2. The timer circuit 226 can be configured to sustain the trigger signal 228 for a time interval that is longer than the duration of the detected transient pulse based on the filtered pulse signal provided the filter 224. In this example, the timer circuit 226 is configured to hold the detected pulse signal for a duration by charging C2 with the voltage drop across R4. The duration of the trigger signal 228 thus depends on the RC time constant of R4 and C2 of the timer circuit 226. The trigger signal 228 is provided to the gate of MP1, such as corresponding to the voltage across the timer circuit 226 as established by the voltage drop across the resistor R4, capacitor C2 and diode Z2.

In response to the trigger signal 228 provided at the gate of MP1, MP1 and MP2 are turned on to shunt the input node 204 with the intermediate node 222 through MP1 and MP2. Thus, in response to the trigger signal 228 activating the clamp network 212 to electrically connect the intermediate node 222 with the input node 204, the portion of the clamp network 212 between node 222 and the input node 204 (e.g., diodes D1 and D1 and MN1) are effectively removed from the active circuit path of the clamp network.

In the absence of the trigger signal 228 activating the switch network of MP1 and MP2 (e.g., fast voltage disturbance is detected at 204 or 206), the intermediate node 222 is not coupled to the node 204 through MP1 and MP2, such that clamping between the nodes 204 and 206 utilizes the diodes D3, D4 and D5 connected between the intermediate node 222 and the output node 206 as well as diodes D1 and D2 between the intermediate node and the input node 204. Thus, when each diode between intermediate node 222 and input node 204 are bypassed, the resulting clamp voltage is reduced by approximately the breakdown voltages of diodes D1 and D2. Similarly, in the absence of the trigger signal, the breakdown voltage of each of D1, D2, D3, D4 and D5, which are connected between input node 204 and output node 206, contribute to the clamp voltage.

The second detector circuit 218 has an input 232 coupled to the input node 204, such as for monitoring the voltage VBB. The second detector circuit 218 also includes an output 234 to provide a control signal to the first detector circuit 216. In this example, the output 234 of the second detector circuit 218 is coupled to the gate of MP3. The second detector circuit 218 is configured to activate the first detector circuit 216 to generate a corresponding trigger signal 228 based on detecting a pulse signal (e.g., a fast-changing voltage pulse having a minimum rise time) at the input node 204 while the transistor device 208 is off.

As an example, the second detector circuit 218 includes a filter circuit 235 coupled to receive the signal at input node 204 through input line 232. The filter circuit 235 is configured to pass fast changing transient voltage signals at the input node 204 (e.g., transient pulse signals above its cutoff frequency) and attenuate or block signals that change more slowly (e.g., pulses below its cutoff frequency). In this example, the filter circuit 235 includes a capacitor CHV1 and a resistor R1 connected between the input node 204 and electrical ground. A Zener diode Z3 may be connected in parallel with the resistor R1 to clamp the voltage across R1 according to the breakdown voltage of the Zener diode D3 (e.g., about 6V). Thus, the filter circuit 235 (similar to filter circuit 224) detects transient voltage disturbances and provides a corresponding filtered pulse signal at the intermediate node between R1 and CHV1.

The filter signal is provided to a gate of NMOS FET MN3. NMOS FET MN3 has a drain connected to the input node 204 and a source connected to ground through a timer circuit 236. For example, the timer circuit 236 includes a resistor R2 connected in parallel with a capacitor C1 between the source of MN3 and electrical ground. The timer circuit 236 is configured to hold the filtered input signal for a duration (e.g., based on the RC time constant of R2 and C1) and provide a corresponding voltage to a gate of another NMOS FET MN4. A Zener diode Z4 can also be connected in parallel with the timer circuit to clamp the voltage of the timer circuit 236. The NMOS FET MN4 has a drain coupled to the gate of MP3 through output connection 234 and a source coupled to the electrical ground. In response to the voltage across the timer circuit 236 reaching a sufficient voltage at the gate of MN4, MN4 is activated to pull the gate of MP3 low through 234, which activates MP3.

In response to the second detector circuit activating MP3 of the first detector circuit (e.g., based on detecting a pulse at the input node 204), the timer circuit 226 imposes a corresponding hold on the trigger signal 228, such as described with respect to the first detector circuit 216 to sustain activation of the clamp network 212 for a period of time. The trigger signal activates the switch network MP1 and MP2 to couple intermediate node 222 to the input node 204 to operate the clamp network at its lower clamp voltage for such time period. In operating conditions when neither detector circuit 216 or 218 detects a sufficient transient electrical disturbance to generate the trigger signal and activate MP1 and MP2, the clamp network 212 provides a higher clamp voltage between the input node 204 and output node 206.

As described above, the clamp voltage between nodes 204 and 206 can be set based on the breakdown voltages of which of the series-connected diodes D1, D2, D3, D4 and D5 are in the active circuit path of the clamp network 212 between the nodes 204 and 206. In an example, when the trigger signal 228 is generated, such as in response to detecting a pulse at 204 or 206, the clamp voltage (e.g., drain-to-source clamp voltage, VDS_CLAMP) will be provided according to the following:

$$VDS\_CLAMP = body\_diode\_of\_MP2 + V\_breakdown\ of\ (D3+D4+D5) + Vth\ of\ MN2 + Vth\ of\ power\ FET.$$

In this example, the clamp voltage is reduced to a level, such as a voltage that is between the maximum supply voltage (e.g., about 28V) and a load dump voltage (e.g., about 40V).

As a further example, in the absence of the trigger signal 228 activating switch network MP1 and MP2, the clamp voltage VDS_CLAMP can be described as follows:

$$VDS\_CLAMP = body\_diode\_of\_MN1 + V\_breakdown\ of\ (D1+D2+D3+D4+D5) + Vth\ of\ MN2 + Vth\ of\ power\ FET.$$

In this example, the clamp voltage can be set to be greater than a load dump voltage (e.g., about 40 volts) and less than a breakdown voltage of the power FET 208. Because the clamp voltage during pulse detection is less than the load dump voltage, the power FET can have a reduced breakdown voltage compared to what can be used in many existing designs. Moreover, because a lower voltage rated power FET 208 can be used due to the clamp circuit 202, the Rsp of the power FET (e.g., its resistance per unit area) can be reduced, which enables a more area-efficient chip to be fabricated.

As a further example, the clamp circuit 202 may be configured to implement the operations described over a range of operating parameters, such as shown in the following table.

| SWITCH DEVICE STATE (208) | VOUT CONDITION (at 206) | STRESS CONDITION | CLAMP NEETWORK OPERATION |
|---|---|---|---|
| Off-state | VOUT has no load | N/A | Because VOUT is floated, no clamping is required. |
| | VOUT has load | ISO Pulse-2A at 204 | Detect ISO pulse, and activate VDS clamp at reduced clamp voltage (e.g., <40 V). |
| | | Negative VOUT ISO pulse at 210 | Detect ISO pulse, and activate VDS clamp at reduced clamp voltage (e.g., <40 V). |
| | | Load Dump | During off-state, VDS clamp is turned-off or shifted higher than about % 5 greater than the expected load dump voltage. No clamping is required. |
| | | Max Supply from VBB | During off-state, VDS clamp is turned-off or shifted higher than max supply. No clamping is required. |
| On-state | VOUT has no load | N/A | Because VOUT is floated, no clamping is required. |
| | VOUT has load | ISO Pulse-2A at 204 | Because device is already in on-state, no clamping is required. |
| | | Negative VOUT ISO pulse at 210 | N/A |
| | | Load Dump | Because device is already in on-state, no clamping is required. |
| | | Max Supply from VBB | No clamping. |
| On-state → Off-state | Negative Inductive fly-back | Output inductor forcing VOUT to negative voltage | Activate VDS clamp below BVDSS of power FET (e.g., <40 V) for time 'T' which is longer than time required for output current to become '0'A. |

Figure 3A:
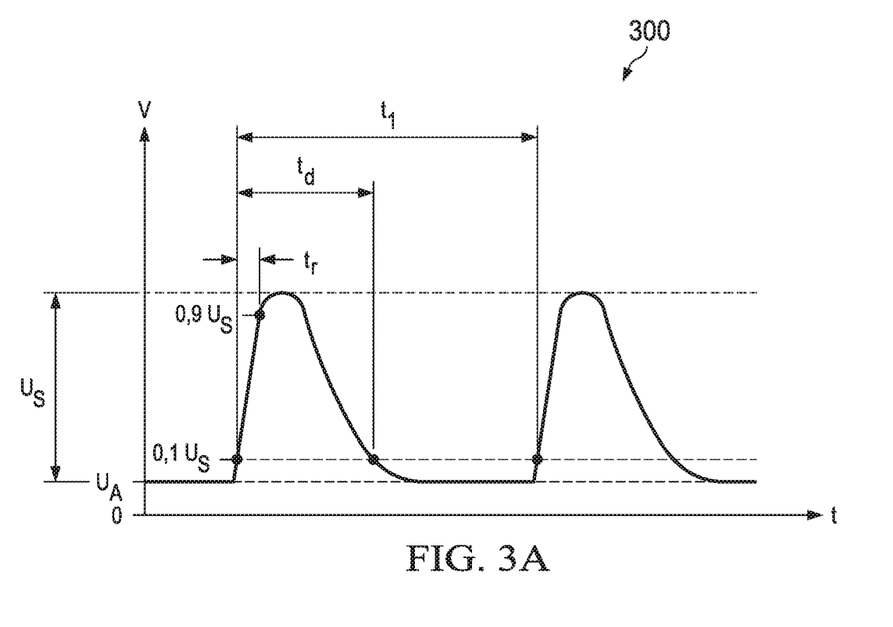
FIGS. 3A and 3B illustrate signal diagrams showing examples of ISO test pulses and associated parameters of the test pulse.
Figure 3B:
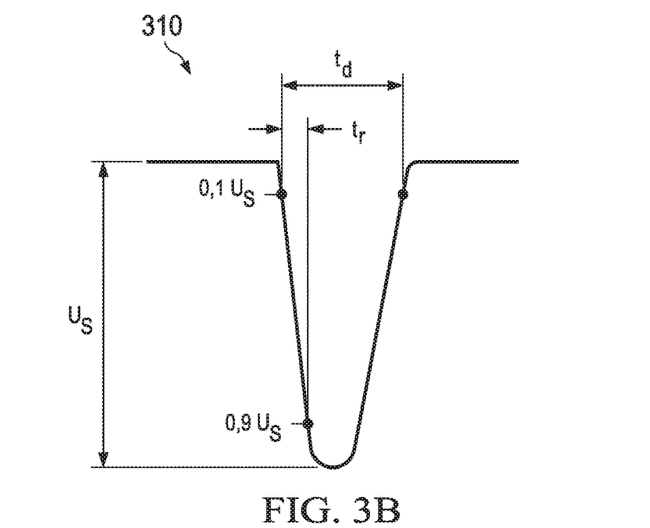

FIGS. 3A and 3B illustrate signal diagrams for test pulse signals 300 and 310, respectively, which can be applied to the system 200 of FIG. 2. For example, FIG. 3A illustrates a test pulse signal 300 that can be applied to the input node 204 according to application requirements, such as during a test phase to ensure that the clamp circuit 202 operates according to expected operating parameters. In the example of FIG. 3A, the test pulse has parameters (e.g., peak voltage amplitude $U_s$, input resistance $R_i$, rise time $t_r$, pulse duration $t_d$ and pulse repetition rate $t_1$). One or more of the pulse parameters can be controlled according to application test requirements. For the example of automotive applications, the pulse 300 may be applied to the input (e.g., input node 204) to simulate transients due to sudden interruption of currents in a device connected in parallel with the power FET 208 due to the inductance of the wiring harness. The following table provides a description of example parameters for the pulse 300 of FIG. 3A that may be used for such automotive applications.

| Parameters | Nominal 12 V and 24 V system |
|---|---|
| $U_s$ | +37 V to +112 V |
| $R_i$ | 2 Ω |
| $t_d$ | 0.05 ms |
| $t_r$ | $(1_{-0.5}^{0})$ µs |
| $t_1{}^a$ | 0.2 s to 5 s |

$^a$The repetition time $t_1$ can be short depending on the switching. The use of a short repetition time reduces the test time.

As a further example, FIG. 3B illustrates a test pulse signal 310 that can be applied to the output node 206 according to application requirements, such as during a test phase to ensure that the clamp circuit 202 operates according to expected operating parameters. In the example of FIG. 3B, the test pulse is a negative pulse having respective parameters (e.g., peak voltage $U_s$, input resistance $R_i$, rise time $t_r$, pulse duration $t_d$, fall time $t_{12}$, off time $t_6$ and pulse repetition rate $t_1$). One or more of the pulse parameters can be controlled according to application test requirements. For the example of automotive applications, a test device may apply the pulse 310 to the output (e.g., output node 206) to simulate transients from DC motors acting as generators after the ignition is switched off. The following table provides a description of example parameters for the pulse 310 of FIG. 3B that may be used for such automotive applications.

| Parameters | Nominal 12 V system | Nominal 24 V system |
|---|---|---|
| $U_s$ | 10 V | 20 V |
| $R_i$ | 0 Ω to 0.05 Ω | |
| $t_d$ | 0.2 s to 2 s | |
| $t_{12}$ | 1 ms ± 0.5 ms | |
| $t_r$ | 1 ms ± 0.5 ms | |
| $t_6$ | 1 ms ± 0.5 ms | |

Figure 4:
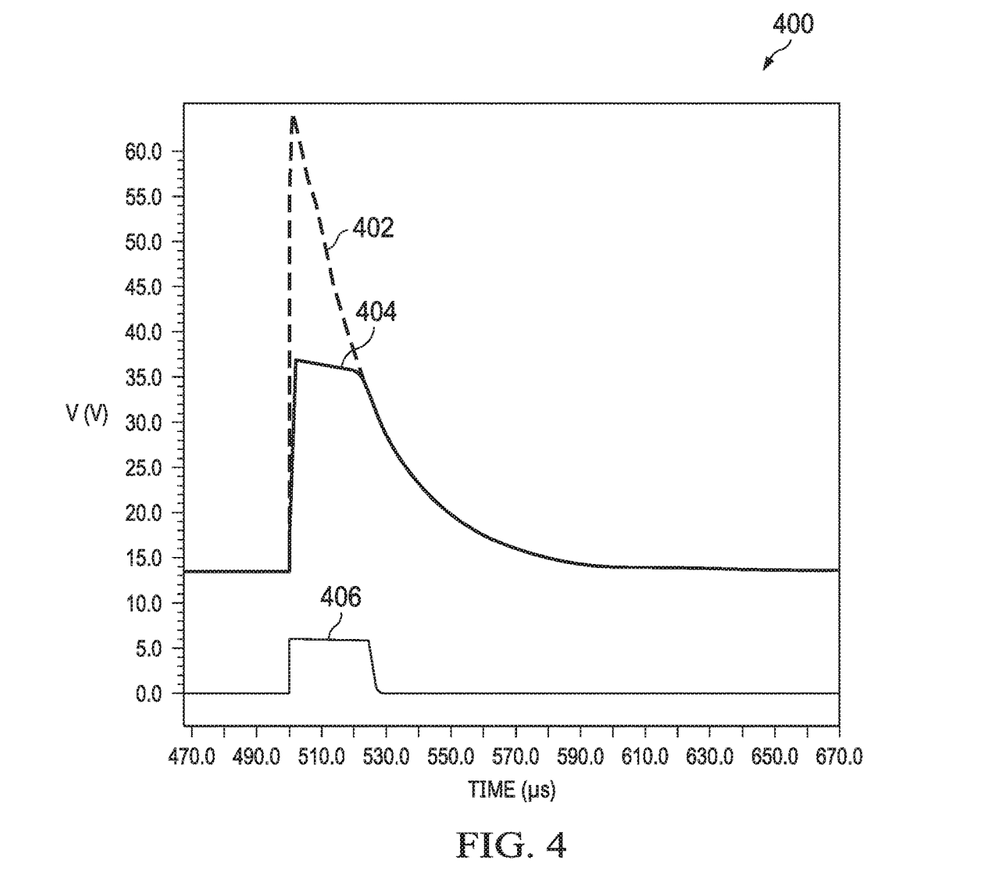
FIG. 4 illustrates an example signal diagram of various signals in the switch protection system in response to applying a positive test pulse.

FIG. 4 illustrates a diagram 400 of various example signals for the switch protection system (e.g., system 100 or 200) in response to applying a positive test pulse at an input of a power switch device (e.g., device 102 or 208). In the example of FIG. 4, the peak voltage of the pulse applied is about 65V. The drain to ground voltage 402 thus exhibits a peak at about 65V less an IR drop across an input impedance (e.g., about 2 ohm). In response to detecting the pulse, the clamp is activated by a trigger signal 406 to clamp the drain-to-source voltage (e.g., between input and output of the power switch device). For example, the drain-to-source voltage (VDS_CLAMP) is clamped to about 36V.

Figure 5:
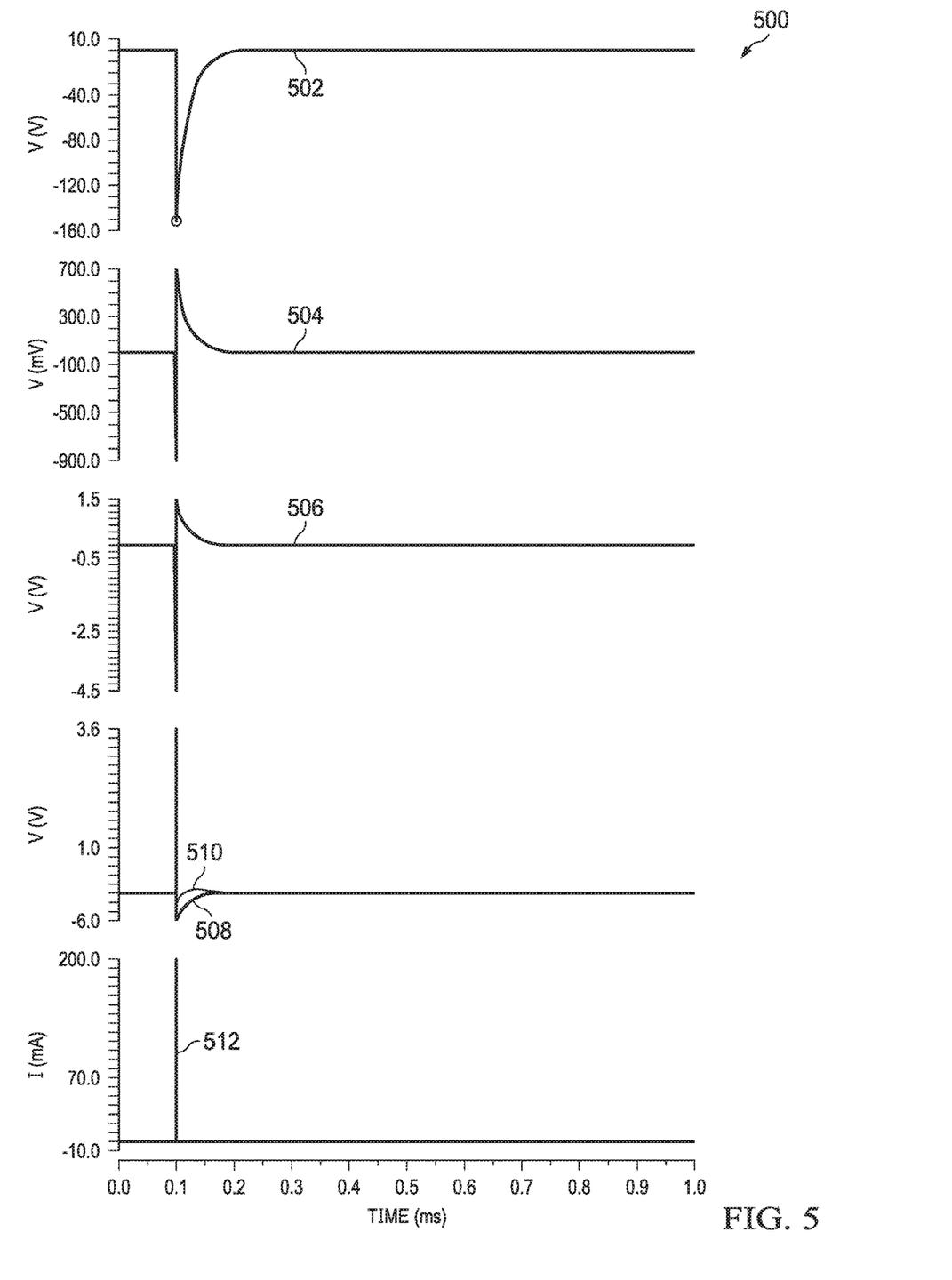
FIG. 5 illustrates an example signal diagram of various signals in the switch protection system in response to applying a negative test pulse.

FIG. 5 illustrates an example signal diagram 500 of various signals in the switch protection system (e.g., system 100 or 200) in response to applying a negative test pulse 502 at the output of the power FET (e.g., 110 or 206). For example, the test pulse has a peak amplitude of about −150V. Application of the test pulse results in a drain voltage 504 and source voltage 506 and clamping of corresponding drain-to-source voltage 508 and gate-to-source voltage 510, as shown. The diagram also shows drain-to-source current 512 associated with the application of the test pulse 502.

Figure 6:
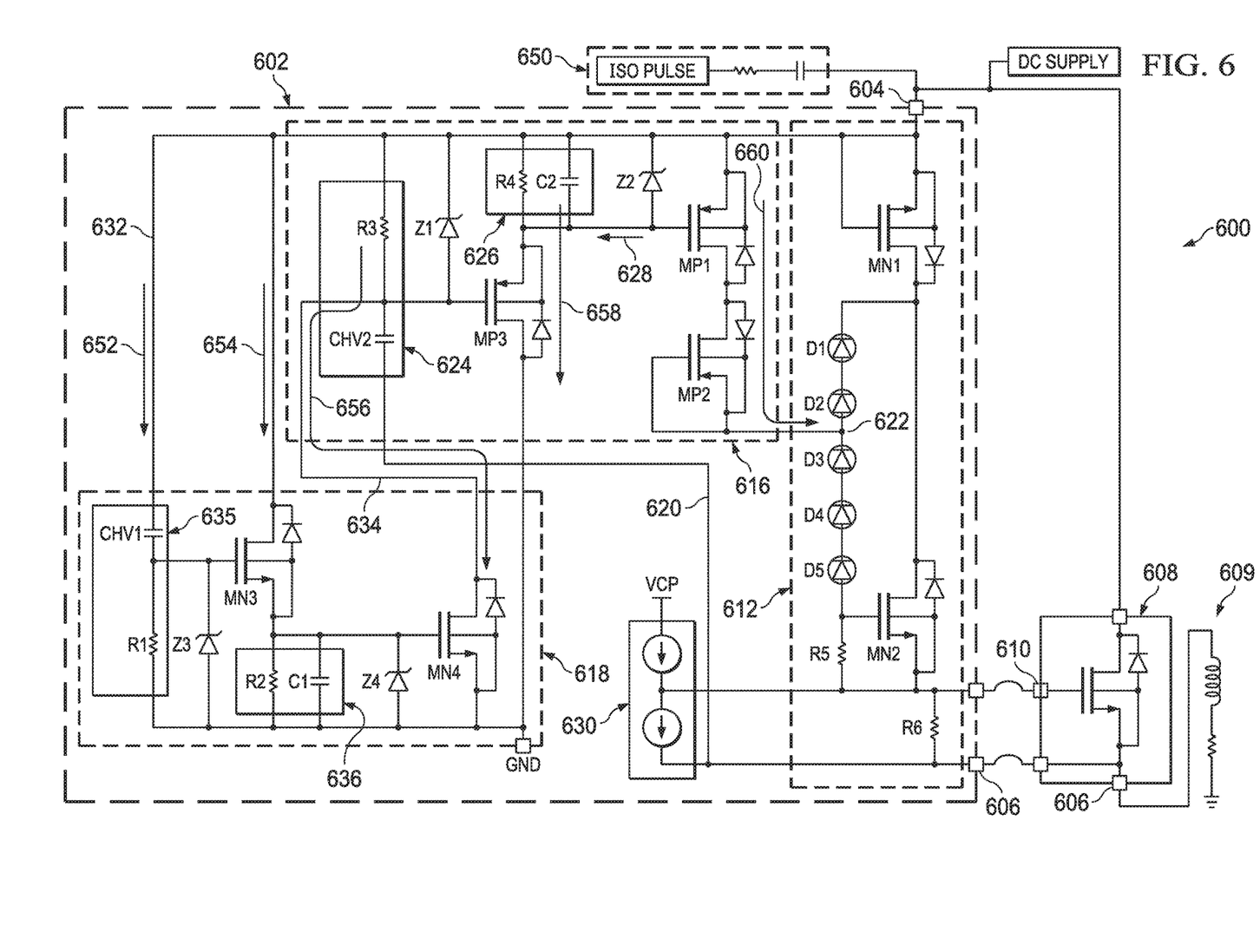
FIG. 6 illustrates the example circuit of FIG. 2 with a positive test pulse being applied at an input.

FIG. 6 illustrates an example switch protection circuit 600 with a positive test pulse (e.g., pulse 300 shown in FIG. 3A) being applied by test circuit 650 at an input 604. Other than circuitry 650, the circuit 600 is the same as FIG. 2. Accordingly, identical reference numbers, increased by adding 400, are used in FIG. 6 to refer to features introduced above with respect to FIG. 2. Therefore, reference may be made back to FIG. 2 for additional information about such features. In this example, the circuitry 650 is configured to apply the negative test pulse at the input node 604. The detector circuit 618 is configured to detect the test pulse. For example, of the positive test pulse applied at 604 provides AC current 652 to the detector 618. The high-pass filter 635 is configured to filter the AC current 652 and activate MN3 to pull current 654 from the input node 604. This activates MN4 to pull current 656 from the input node 604. The current 656 provides a voltage drop across R3 to turn on MP3. While MP3 is turned on, current 658 provides a voltage drop across timer circuit 626 to, in turn, generate a trigger signal 628 for controlling FETs MP1 and MP2 and activating the clamp network 612 as disclosed herein.

Figure 7:
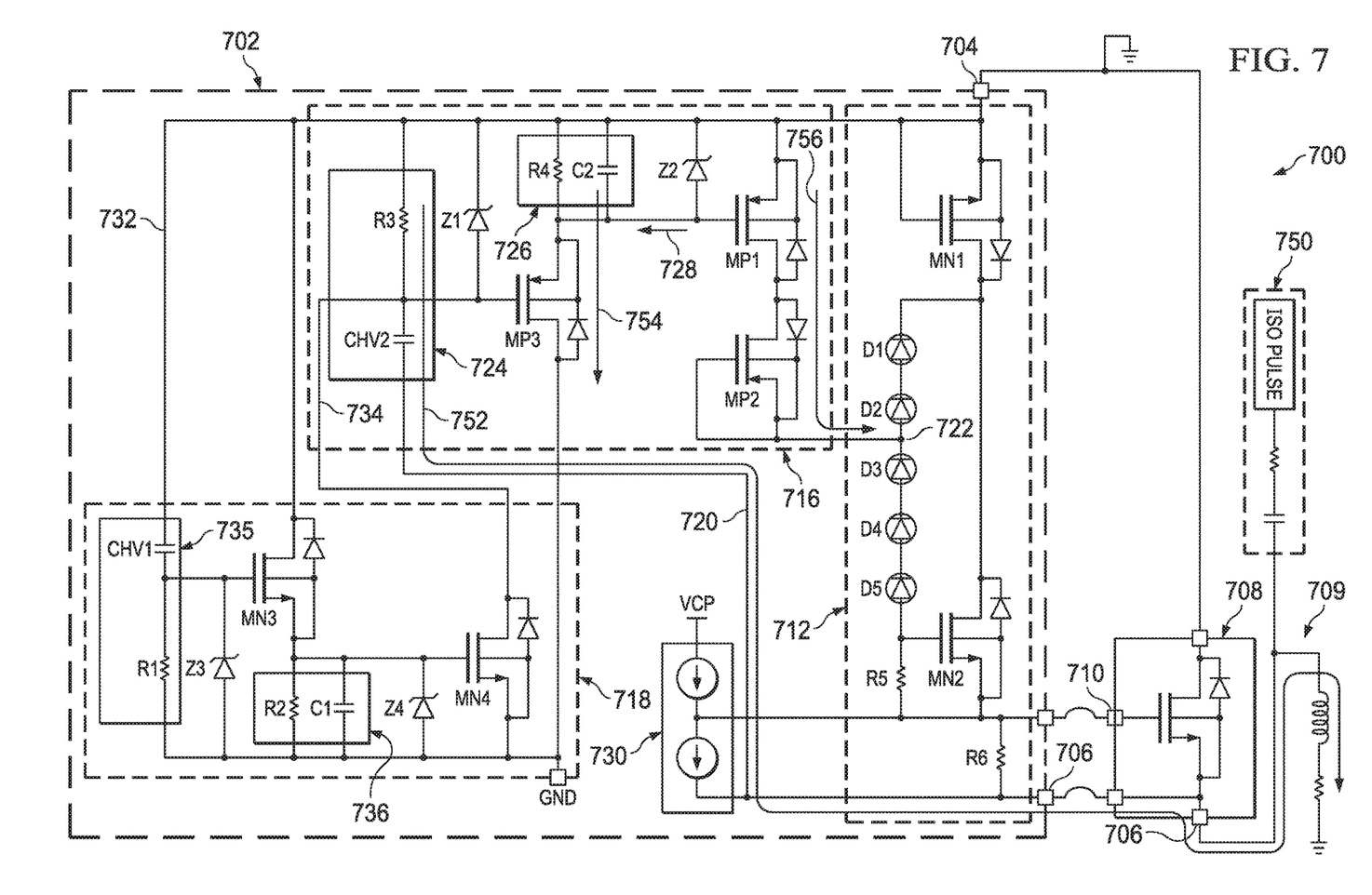
FIG. 7 illustrates the example circuit of FIG. 2 with a negative test pulse being applied at an output.

FIG. 7 illustrates the example switch protection circuit 700 with a positive test pulse (e.g., pulse 310 shown in FIG. 3B) being applied by test circuit 750 at an output 706. Other than circuitry 750, the circuit 700 is the same as FIG. 2. Accordingly, identical reference numbers, increased by adding 500, are used in FIG. 7 to refer to features introduced above with respect to FIG. 2. Therefore, reference may be made back to FIG. 2 for additional information about such features. In this example, the circuitry is configured to apply a negative test pulse at the output 706. The detector circuit 716 is configured to detect the test pulse. For example, the filter 752 filter an AC current that is generated in response to the test pulse at 706. The current 752 provides a voltage drop across R3 to turn on MP3 for a duration. While MP3 is turned on, current 754 provides a time-varying voltage drop across timer circuit 726 to, in turn, generate a trigger signal 728 for controlling FETs MP1 and MP2 and activating the clamp network 712 as disclosed herein.

Figure 8:
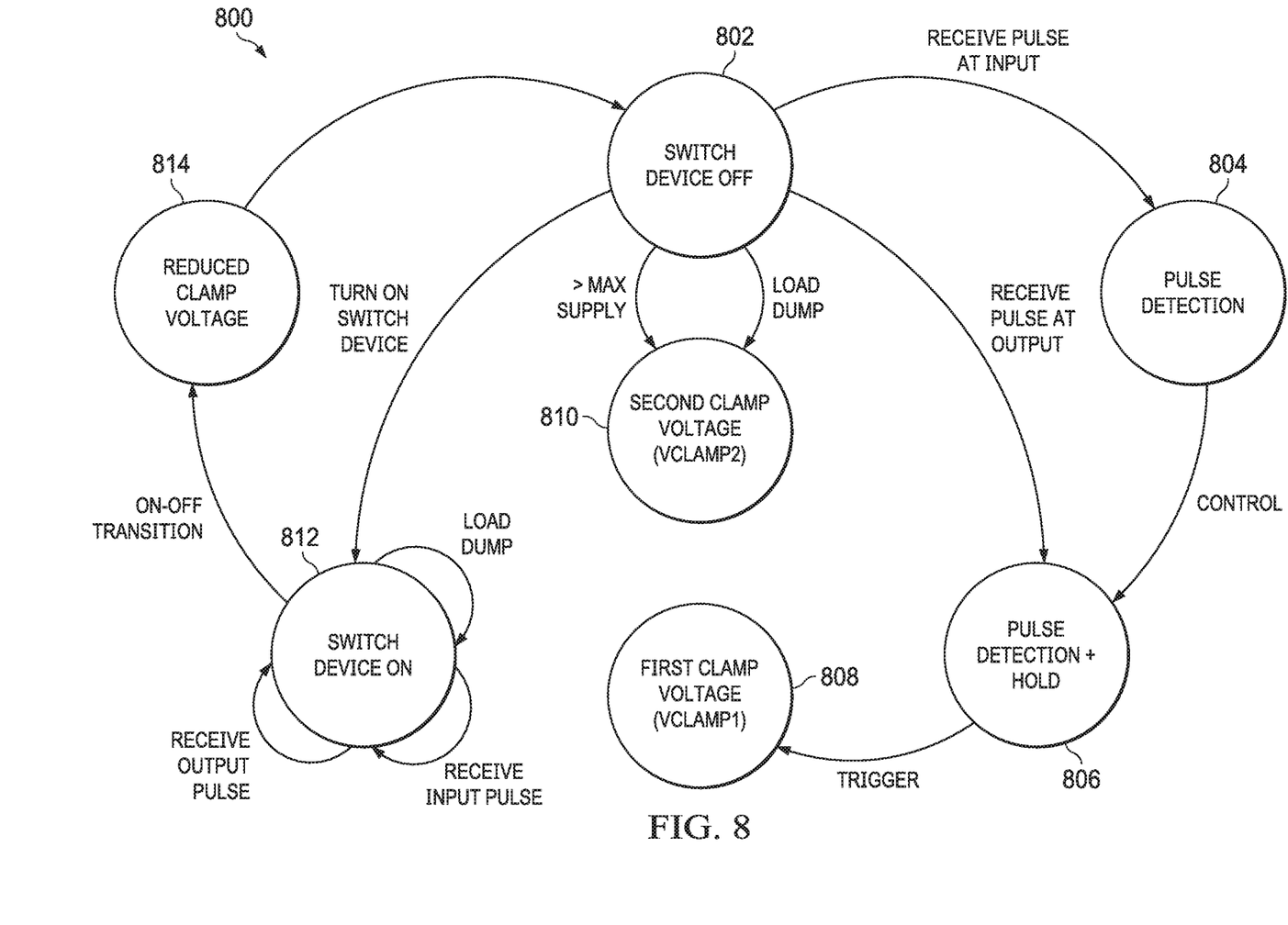
FIG. 8 illustrates an example of a state diagram demonstrating operation of a switch protection system.

FIG. 8 is an example of a state diagram 800 demonstrating operation of the protection system (e.g., system 100 or 200). The state diagram 800 illustrates operating conditions and state changes for a switch device (e.g., switch 102, 208) and a clamp circuit (e.g., protection system 100 or circuit 202), such as disclosed herein. In an off state, when the switch device (e.g., switch 102, 208) is turned off, at 802, detector circuitry (e.g., 120, 122, 124, 216, 218) monitors for transient electrical disturbances at an input as well as an output of the switch device. In response to receiving a pulse signal at an input (e.g., input 108 or input 204), pulse detection is implemented at 804 (e.g., by second detector circuit 124, 218). In response to detecting a transient pulse exceeding threshold parameters (and buffering the detected pulse), a control signal is generated for activating first detector circuit to hold the trigger signal for a period of time, at 806. For example, the duration of the hold is sufficient to sustain activation of the clamp network during the transient pulse signal that was detected. Commensurate with the duration of the hold implemented at 806, the first detector circuit generates the trigger to activate the clamp network, at 808, to provide a first clamp voltage (VCLAMP1). For example, the clamp voltage at 808 is reduced from a second, higher clamp voltage (VCLAMP2) in response to the trigger signal causing a bypass of a portion of the clamp network circuit or otherwise reducing the effective clamping voltage of the clamp network. After the hold terminates, the operation can return to 802, in which the clamp can be deactivated so that it is configured to clamp to the second clamp voltage VCLAMP2, at 810.

Additionally, while the switch device is turned off, at 802, in response to receiving a transient pulse at the output (e.g., 110, 206), pulse detection and hold are implemented at 806 (e.g., by first detector circuit 122, 216). Commensurate with the duration of the hold implemented at 806, the first detector circuit generates the trigger to activate the clamp network, at 808, to provide the first clamp voltage VCLAMP1. Thus, at 808, the clamp network is configured to provide a reduced clamp voltage, as disclosed herein. After the hold terminates, the operation can return to 802.

While the switch device is turned off, at 802, in response to detecting other transient conditions at the input or output transition, which are not detected at 804 or 806 as sufficient to warrant activation of the clamp to VCLAMP1, the circuit can operate to apply the second higher clamp voltage VCLAMP2, at 810. Examples of conditions that may result in operating the clamp at its higher clamp voltage VCLAMP2 may include load dump and when something greater than the max supply voltage is applied at the input of the power switch.

Additionally, from the off state at 802, the switch device may be turned on in response to activation of a corresponding input (e.g., user control or automatic control) to transition to an on state at 812. At 812, when the switch device is on, clamping generally is not required even during transient electrical disturbances at the input or output, including during low dump as well as when an input or output pulse is received. Additionally, at 814, in response to a transition from the on state, at 812, back to the off state, at 802 (an on-off transition), the clamp network is activated to its reduced clamp voltage VCLAMP1 for a time interval that is sufficient for the output current through the switch device to reduce to about 0 A. After the time interval has lapsed, the switch device can remain in the off state, at 802, to continue operating as disclosed herein.

In view of the foregoing structural and functional features, the example embodiments disclosed herein, provide clamp circuitry to protect power switch devices across a variety of transient electrical disturbances and operating conditions. Example embodiments do not require any bias circuit such that pulses applied to the input and/or output can be detected by the clamp circuit during a complete off-state and the clamp circuit can be activated accordingly. Because the clamp circuit can adaptively control the clamp voltage for the power FET, the breakdown voltage requirement of the power FET can be reduced significantly (e.g., about 20%-50%) for a given range of operating conditions and process parameters. Because the breakdown voltage can be reduced, a smaller power FET can be used, which can result in reducing the footprint area of the circuit on the IC. Additionally, a separate clamp circuit for VBB is not required, which can also help reduce the size of the overall protection circuit.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. In this description, the term "based on" means based at least in part on. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A device comprising:
a first detector circuit comprising:
a filter coupled to a first terminal, the filter configured to filter a detected first pulse signal to produce a filtered pulse signal; and
a timer configured to produce a trigger signal for a time period based on the filtered pulse signal; and
a second detector circuit coupled to the first detector circuit, the second detector circuit configured to instruct the first detector circuit to produce the trigger signal responsive to detecting a second pulse signal; and
a clamp network configured to clamp a voltage between a second terminal and the first terminal to a first clamp voltage in response to the trigger signal having a first value, and to a second clamp voltage in response to the trigger signal having a second value, the second clamp voltage being greater than the first clamp voltage.

2. The device of claim 1, wherein the first detector circuit further comprises a switch network coupled between the second terminal and a third terminal of the clamp network, the switch network configured to connect the third terminal to the second terminal in response to the trigger signal having the first value.

3. The device of claim 1, wherein the timer is a first timer, the filtered pulse signal is a first filtered pulse signal, and the filter is a first filter, wherein the second detector circuit further comprises:
a second filter coupled to the second terminal, the second filter configured to filter the detected second pulse signal to produce a second filtered pulse signal; and
a second timer configured to activate the first timer based on the second filtered pulse signal.

4. The device of claim 3, wherein the first filter comprises a first high pass filter and the second filter comprises a second high pass filter, and
wherein the first timer comprises a first resistor-capacitor network and the second timer comprises a second resistor-capacitor network.

5. The device of claim 1, wherein the clamp network comprises a series of diodes coupled to the first and second terminals, the first detector circuit configured to connect the second terminal to a diode of the series of diodes in response to the trigger signal having the first value.

6. The device of claim 1, further comprising a switch device coupled between the first and second terminals, the switch device comprising a field effect transistor having a drain and a source, the drain coupled to the second terminal, and the source coupled to the first terminal, the first clamp voltage being less than a breakdown voltage of the field effect transistor.

7. The device of claim 6, wherein the second clamp voltage is greater than a load dump voltage and less than a breakdown voltage of the switch device.

8. The device of claim 1, wherein the first detector circuit and the second detector circuit are configured to activate the clamp network to the first clamp voltage for a time interval.

9. The device of claim 6, wherein the field effect transistor has a gate coupled to the clamp network, the device further comprising a resistor being coupled between the gate and the source.

10. The device of claim 1, wherein the first detector circuit, the second detector circuit, and the clamp network are on a common substrate of an integrated circuit chip.

11. A circuit, comprising:
a clamp network comprising a series of diodes having a first anode and a first cathode, the series of diodes comprising a first diode having a second anode and a second diode having a second cathode, the second cathode coupled to the second anode;
a first detector circuit having a first detector input and a second detector input, the first detector input coupled to the first anode, the first detector circuit comprising:
a switch network coupled between the first cathode and the second cathode;
a filter coupled to the first cathode and to the first anode, wherein the filter is configured to filter a pulse signal at the first anode to produce a filtered pulse signal; and
a timer coupled to the filter, wherein the timer is configured to produce a trigger signal to activate the switch network for a duration based on the filtered pulse signal; and
a second detector circuit having a third detector input and a detector output, the third detector input coupled to the first cathode and the detector output coupled to the second detector input.

12. The circuit of claim 11, wherein the clamp network is configured to clamp a voltage between the first cathode and the first anode to a first clamp voltage in response to a trigger signal turning on the switch network to couple the second cathode to the first cathode, and to a second clamp voltage while the switch network is turned off based on the trigger signal, and the second clamp voltage being greater than the first clamp voltage.

13. The circuit of claim 11, wherein the filter is a first filter, the timer is a first timer, the filtered pulse signal is a first filtered pulse signal, and the pulse signal is a first pulse signal, and wherein the second detector circuit further comprises:
a second filter having a filter input coupled to the first cathode, wherein the second filter is configured to provide a second filtered pulse signal responsive to receiving a second pulse signal at the filter input; and
a second timer configured to control a switch device based on the second filtered pulse signal.

14. The circuit of claim 13, wherein the first filter is a first high pass filter configured to buffer the first pulse signal, and
wherein the first timer comprises a resistor-capacitor network configured to sustain the trigger signal for a period of time.

15. The circuit of claim 12, further comprising a power transistor coupled between the first cathode and the first anode, the power transistor having a control input, the circuit further comprising a resistor coupled between the control input and the first anode.

16. The circuit of claim 15, wherein the power transistor is a field effect transistor having a drain, a source, and a gate, the drain coupled to the first cathode, the source coupled to the first anode, and the gate coupled to the control input, the first clamp voltage being less than a breakdown voltage of the field effect transistor.

17. A system comprising:
a power transistor having a first current terminal and a second current terminal;
a clamp network comprising:
  a first series of diodes having a first cathode and a first anode, wherein the first cathode is coupled to the first current terminal; and
  a second series of diodes having a second cathode and a second anode, wherein the second cathode is coupled to the first anode, and the second anode is coupled to the second current terminal;
a first detector circuit coupled to the first current terminal and to the second current terminal, the first detector circuit having a detector input coupled to the second current terminal, the first detector circuit comprising a switch network coupled to the first current terminal and to the first anode, the switch network configured to couple the first anode to the first current terminal in response to a trigger signal having a first value for a time interval; and
a second detector circuit coupled to the first current terminal, wherein the second detector circuit is configured to detect a pulse signal at the first current terminal and to provide a control signal to the first detector circuit.

* * * * *